(12) United States Patent
Bang et al.

(10) Patent No.: US 7,906,423 B2
(45) Date of Patent: Mar. 15, 2011

(54) SEMICONDUCTOR DEVICE AND METHOD OF MANUFACTURING THE SAME

(75) Inventors: Hyo-Jae Bang, Cheonan-si (KR); Heui-Seog Kim, Cheonan-si (KR); Dong-Chun Lee, Cheonan-si (KR); Seong-Chan Han, Cheonan-si (KR); Jung-Hyeon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/650,093

(22) Filed: Dec. 30, 2009

(65) Prior Publication Data

US 2010/0105201 A1  Apr. 29, 2010

Related U.S. Application Data

(62) Division of application No. 11/978,370, filed on Oct. 29, 2007, now Pat. No. 7,663,219.

(30) Foreign Application Priority Data

Nov. 10, 2006  (KR) .................. 10-2006-0110766

(51) Int. Cl.
  *H01L 21/44* (2006.01)
(52) U.S. Cl. ................... 438/612; 438/613; 257/735
(58) Field of Classification Search .................. 438/613, 438/646, 760, 612; 257/735
  See application file for complete search history.

(56) References Cited

U.S. PATENT DOCUMENTS

| 4,910,584 A | * | 3/1990 | Mizuo | 257/713 |
| 2002/0034872 A1 | | 3/2002 | Kazama et al. | |
| 2003/0024197 A1 | * | 2/2003 | Diamond | 52/514 |
| 2003/0224197 A1 | * | 12/2003 | Soga et al. | 428/570 |
| 2004/0065954 A1 | | 4/2004 | Weiser et al. | |
| 2006/0033214 A1 | * | 2/2006 | Tomono | 257/772 |

FOREIGN PATENT DOCUMENTS

| EP | 0711104 B1 | 9/1999 |
| JP | 7-38225 A | 2/1995 |
| JP | 8-130267 A | 5/1996 |
| JP | 10-284828 A | 10/1998 |
| JP | 11-177222 A | 7/1999 |

OTHER PUBLICATIONS

"Semiconductor Device and Method of Manufacturing the Same" Specification, Drawings, and Prosecution History of U.S. Appl. No. 11/978,370, filed Oct. 29, 2007, by Hyo-Jae Bang, et al., which is stored in the United States Patent and Trademark Office (USPTO) Image File Wrapper (IFW) system.

* cited by examiner

*Primary Examiner* — Steven Loke
*Assistant Examiner* — Kimberly M Thomas
(74) *Attorney, Agent, or Firm* — Mills & Onello, LLP (57) ABSTRACT

A semiconductor device includes a semiconductor package, a circuit board and an interval maintaining member. The semiconductor package has a body and a lead protruded from the body. The circuit board has a first land electrically connected to the lead. The interval maintaining member is interposed between the circuit board and the body. The interval maintaining member maintains an interval between the lead and the first land. Thus, an interval between the lead and the land is uniformly maintained, so that a thermal and/or mechanical reliability of the semiconductor device is improved.

7 Claims, 6 Drawing Sheets

SEMICONDUCTOR DEVICE AND METHOD OF MANUFACTURING THE SAME

CROSS-REFERENCE TO RELATED APPLICATION

This application is a divisional application of U.S. patent application Ser. No. 11/978,370, filed on Oct. 29, 2007, which claims the benefit of Korean patent application number 10-2006-0110766, filed on Nov. 10, 2006, in the Korean Intellectual Property Office, the contents of which applications are incorporated herein in their entirety by reference.

BACKGROUND OF THE INVENTION

1. Field of the Invention

Example embodiments of the present invention relate to a semiconductor device and a method of manufacturing the semiconductor device. More particularly, example embodiments of the present invention relate to a semiconductor device having a substrate and a semiconductor package mounted on the substrate, and a method of manufacturing the semiconductor device.

2. Description of the Related Art

Generally, a semiconductor device is manufactured by various processes, such as a chip fabricating (FAB) process, an electrically die sorting (EDS) process, a packaging process, a mounting process, etc. In the chip fabricating process, a semiconductor chip including integrated circuits is formed on a silicon substrate. In the EDS process, the semiconductor chip is electrically tested and is sorted. In the packaging process, the semiconductor chip is protected by being packaged into a semiconductor package. In the mounting process, the semiconductor package is mounted on a circuit board.

The semiconductor package includes the semiconductor chip, a molding member and a lead. The molding member protects the semiconductor chip. In addition, the lead protruded from the molding member can be used to transmit an electric signal to the semiconductor chip.

The lead is electrically connected to a conductive pattern (hereinafter, referred to as "land") formed on the circuit board by the mounting process. Particularly, after a solder is formed on the land, the lead is mounted on the land. The solder is heated to a temperature no less than about 200° C. to melt the solder. The molten solder is then cooled. The lead is soldered to the land using the solidified solder. However, a material included in the solder moves to an upper portion of the lead, along the lead, during heating of the solder, so that an interval (hereinafter referred to as "standoff") between an end portion of the land and an end portion of the lead can become narrower. Accordingly, when the semiconductor device is exposed to a temperature of no less than about 400° C., a stress concentrates at the end portions of the land and the lead. This can be because a shear strain applied to the solder is inversely proportion to the standoff. As a result, a crack can be generated at the solder formed between the end portions of the land and the lead. In addition, when a thermal shock and/or a mechanical shock are applied to the semiconductor device, the crack can spread such that an electrical short and/or a mechanical separation between the land and the lead can be generated.

SUMMARY OF THE INVENTION

In accordance with the present invention, provided is a semiconductor device capable of improving a reliability of a conductive member formed between a lead and a land.

Also in accordance with the present invention, provided is a method of manufacturing the above-mentioned semiconductor device.

In accordance with one aspect of the present invention, a semiconductor device includes a semiconductor package, a circuit board and an interval maintaining member. The semiconductor package has a body and a lead protruded from the body. The circuit board has a first land electrically connected to the lead. The interval maintaining member is interposed between the circuit board and the body. The interval maintaining member maintains an interval between the lead and the first land.

In accordance with another aspect of the present invention, a method of manufacturing a semiconductor device is provided. A semiconductor package including a body and a lead protruded from the body is provided. A circuit board including a first land and a second land is provided. Here, the first land is electrically connected to the lead, and the second land is partially overlapped with a lower face of the body. An interval maintaining member is formed on the second land. Here, the interval maintaining member maintains an interval between the lead and the first land. The lead is soldered to the first land using a first solder.

The semiconductor device can further comprise a conductive member electrically connecting the lead to the first land.

Each of the conductive member and the interval maintaining member can include a solder.

The conductive member and the interval maintaining member can include different materials.

The conductive member can include a first material having a first melting point and the interval maintaining member can include a second material having a second melting point substantially higher than the first melting point.

The conductive member can include an alloy comprising tin (Sn), silver (Ag), copper (Cu) and bismuth (Bi) and the interval maintaining member can include an alloy comprising tin (Sn), silver (Ag) and copper (Cu).

The circuit board further can comprise a second land configured to support the interval maintaining member.

The second land can have an area smaller than the area of the first land.

A plurality of the interval maintaining members can be formed between the circuit board and the body, and the interval maintaining members can make contact with a lower face of a peripheral portion of the semiconductor package, adjacent to the first land.

The interval maintaining members can make contact with lower faces of corner portions of the semiconductor package.

In still another aspect of the present invention, a method of manufacturing a semiconductor device is also provided. A semiconductor package including a body and a lead protruded from the body is provided. A circuit board including a first land and a second land is provided. Here, the first land is electrically connected to the lead, and the second land is partially overlapped with a lower face of the body. A first preliminary solder having a first melting point is formed on the first land. A second preliminary solder is formed on the first preliminary solder to form a first solder including the first and the second preliminary solders on the first land. The second preliminary solder has a second melting point substantially higher than the first melting point. A second solder having the second melting point is formed on the second land. The first and the second solders are melted to form a first melted solder and a second melted solder. The second melted solder is solidified to form an interval maintaining member on the second land. Here, the interval maintaining member maintains an interval between the first land and the lead. The first molten solder is solidified to form a conductive member on the second land.

Forming the interval maintaining member can comprise forming a second solder on the second land, the second solder including a material different from the first solder.

The first solder can be formed using a first material having a first melting point and the second solder can be formed using a second material having a second melting point higher than the first melting point.

The first solder can be formed from an alloy comprising tin (Sn) and bismuth (Bi), and the second solder can be formed from an alloy comprising tin (Sn), silver (Ag) and copper (Cu).

Forming the interval maintaining member can comprise: forming the second solder on the second land; melting the first and the second solders at a temperature higher than the second melting point; and solidifying the second solder at a temperature between the first and the second melting points.

Soldering the lead can comprise solidifying the first solder at a temperature below the first melting point.

A plurality of the interval maintaining members can be formed on the second land, and the interval maintaining members can make contact with a lower face of a peripheral portion of the semiconductor package, adjacent to the first land.

According to aspects of the present invention, the interval maintaining member is formed between the body of the semiconductor package and the circuit board, so that the interval between the lead and land can be uniformly maintained. Thus, when a thermal-mechanical shock is applied to the solder interposed between the lead and the land, a shear strain applied to the solder having a predetermined height can decrease. Accordingly, thermal-mechanical reliability between the lead and the land can be improved.

The first solder can be formed from an alloy comprising tin (Sn) and bismuth (Bi), and the second solder can be formed from an alloy comprising tin (Sn), silver (Ag) and copper (Cu).

Solidifying the first melted solder can be performed at a temperature below a third melting point, which is between the first melting point and the second melting point.

BRIEF DESCRIPTION OF THE DRAWINGS

The present invention will become readily apparent by reference to the following detailed description when considered in conjunction with the accompanying drawings. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DESCRIPTION OF THE EMBODIMENTS

Aspects of the present invention are described more fully hereinafter with reference to the accompanying drawings, in which example embodiments in accordance with the present invention are shown. The present invention can, however, be embodied in many different forms and should not be construed as limited to the example embodiments set forth herein. In the drawings, the sizes and relative sizes of layers and regions can be exaggerated for clarity.

It will be understood that when an element or layer is referred to as being "on," "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments in accordance with aspects of the present invention should not be construed as limited to the particular shapes of regions illustrated herein but, are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Figure 1:
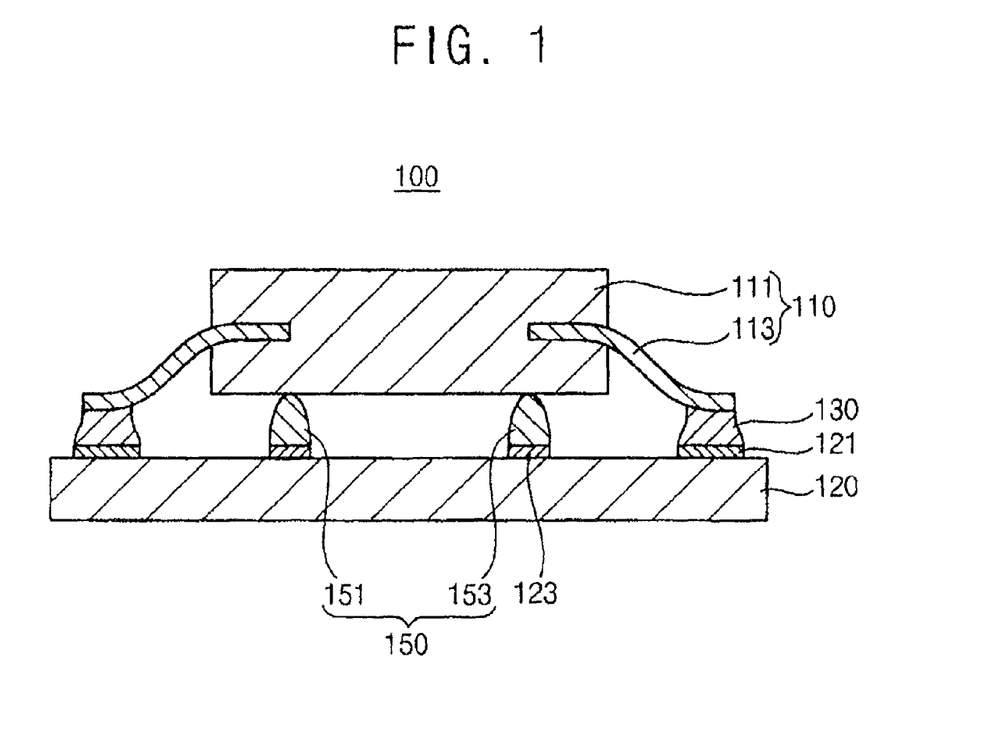
FIG. 1 is a cross sectional view illustrating an example embodiment of a semiconductor device in accordance with aspects of the present invention.

FIG. 1 is a cross sectional view illustrating an embodiment of a semiconductor device in accordance with an aspect of the present invention.

Referring to FIG. 1, the semiconductor device 100 includes a semiconductor package 110, a circuit board 120, a conductive member 130, and an interval maintaining member 150.

The semiconductor package 110 can have a plate shape having a relatively thin thickness. The semiconductor package 110 includes a body 111 and a lead 113.

The body 111 includes a semiconductor substrate (not shown), integrated circuits (not shown) formed on the semiconductor substrate, and a molding member (not shown). The integrated circuits have a plurality of switching elements, such as a diode, a transistor, etc., and a plurality of storage elements, such as a capacitor, etc., to store data. The molding member covers the integrated circuits to protect the integrated circuits. The body 111 can correspond to a semiconductor chip.

The lead 113 protrudes from the body 111. For example, the lead 113 can protrude from a side of the body 111. Alternatively, the lead 113 can protrude from an upper face or a lower face of the body 111. The lead 113 can have an inclined "S" shape. Alternatively, the lead 113 can have an "L" shape. The lead 113 can include a conductive metal, such as copper (Cu), aluminum (Al), gold (Au), silver (Ag), etc. These can be used alone or in a combination thereof. The lead transmits an electric signal between the integrated circuits and elements formed on the circuit board 120. A plurality of leads in the form of the lead 113 can be protruded from the body 111 to transmit various signals at the same time between the integrated circuits and the elements.

The circuit board 120 is positioned under the semiconductor package 110. The circuit board 120 includes an insulation plate (not shown) and a conductive pattern (not shown) formed on the insulation plate. The conductive pattern receives/applies an electric signal from/to the semiconductor chip of the semiconductor package.

The circuit board 120 further includes a first land 121 electrically connected to the lead 113. The first land 121 faces an end portion of lead 113. The first land 121 can include a conductive metal, such as copper (Cu), aluminum (Al), gold (Au), silver (Ag), etc. These can be used alone or in a combination thereof. A number of the first land 121 can correspond to a number of the lead 113. For example, when the lead 113 can be formed in a plural number, the first land 113 can be formed in the plural number identical to the number of the lead 113.

In example embodiments, the circuit board 120 can further include a second land 123. The second land 123 supports the interval maintaining member 150. The second land 123 is positioned to correspond to a portion of a lower face of the semiconductor package 110. For example, the second land 123 can be arranged to correspond to a peripheral portion of the lower face of the semiconductor package 110. Alternatively, when the semiconductor package 110 has a rectangular plate shape, the second land 123 can be arranged to face four corner portions of the semiconductor package 110.

The second land 123 can have an area smaller than that of the first land 121. When the second land 123 is smaller than the first land 121 and the interval maintaining member 150 includes a solder, the interval maintaining member 150 has an area substantially the same as that of the second land 123. Thus, the interval maintaining member 150 can be formed on the second land 123 by using a relatively small quantity of solder as compared the case where the second land 123 has the area larger than that of the first land 121.

The conductive member 130 is interposed between the first land 121 and the lead 113. For example, the conductive member 130 is interposed between the first land 121 and an end portion of the lead 113. The conductive member 130 can include a first material, such as tin (Sn), silver (Ag), copper (Cu), bismuth (Bi) or an alloy thereof. For example, the conductive member 130 in this embodiment includes an alloy having tin (Sn), silver (Ag), copper (Cu) and bismuth (Bi). The conductive member 130 includes the first material having a first melting point. For example, the conductive member 130 includes the alloy that is manufactured by melting a first mixture and a second mixture at a volume ratio of about 9:1. The first mixture includes tin (Sn), silver (Ag) and copper (Cu) at a weight ratio of about 96.5:3.0:0.5, whereas the second mixture includes tin (Sn) and bismuth (Bi) at a weight ratio of about 42.0:58.0. When the conductive member 130 includes the alloy that is manufactured by melting a first mixture and a second mixture at a volume ratio of about 9:1, the conductive member has a melting point of about 170° C.

The interval maintaining member 150 is interposed between the circuit board 120 and the body 111 of the semiconductor package 110. In example embodiments, the interval maintaining member 150 is formed on the second land 123. The interval maintaining member 150 uniformly maintains an interval between the first land 121 and the lead 113. A height of the interval maintaining member 150 can be adjusted considering an interval between the first land 121 and the lead 113. For example, the interval maintaining member 150 has the height of about 50 μm to about 150 μm measured from an upper face of the circuit board 120.

The interval maintaining member 150 can be positioned in a plural number to make contact with a peripheral portion of the body 111. For example, the interval maintaining member 150 includes a first interval maintaining member 151 and a second interval maintaining member 153. In example embodiments, the first interval maintaining member 151 and the second interval maintaining member 153 are positioned to make contact with the peripheral portion of the body 111.

The interval maintaining member 150 includes a second material having a second melting point higher than the first melting point of the conductive member 130. For example, the interval maintaining member 150 includes an alloy having tin (Sn), silver (Ag), copper (Cu), etc. When the interval maintaining member 150 includes the alloy having tin (Sn), silver (Ag) and copper (Cu) at a weight ratio of about 96.5:3.0:0.5, the interval maintaining member 150 has a melting point of about 217° C.

When the interval maintaining member 150 includes the second material having the second melting point higher than the first melting point of the first material, the second material is melted together with the first material of the conductive member 130 at a temperature above the second melting point. Then, the second material is solidified at a temperature between the first melting points and the second melting point to form the interval maintaining member 150 on the second land 123. The first material is solidified at under the first melting point to form the conductive member 130 on the first land 121, thereby combining the lead 113 with the first land 121. Thus, the interval maintaining member 150 is formed on the second land 123 before forming the conductive member 130 on the first land 121. Accordingly, the interval maintaining member 150 uniformly maintains a standoff. Here, the standoff can correspond to the interval between the lead 113 and the first land 121. As a result, the conductive member 130 can have an improved thermal reliability.

Further, when an external shock is applied to the semiconductor device 100, the interval maintaining member 150 can absorb the shock to prevent the external shock from being imposed to the conductive member 130. Thus, the semiconductor device 100 can have an improved mechanical strength.

FIGS. 2 to 6 are cross sectional views illustrating an example embodiment of a method of manufacturing a semiconductor device in accordance with an aspect of the present invention.

Figure 2:
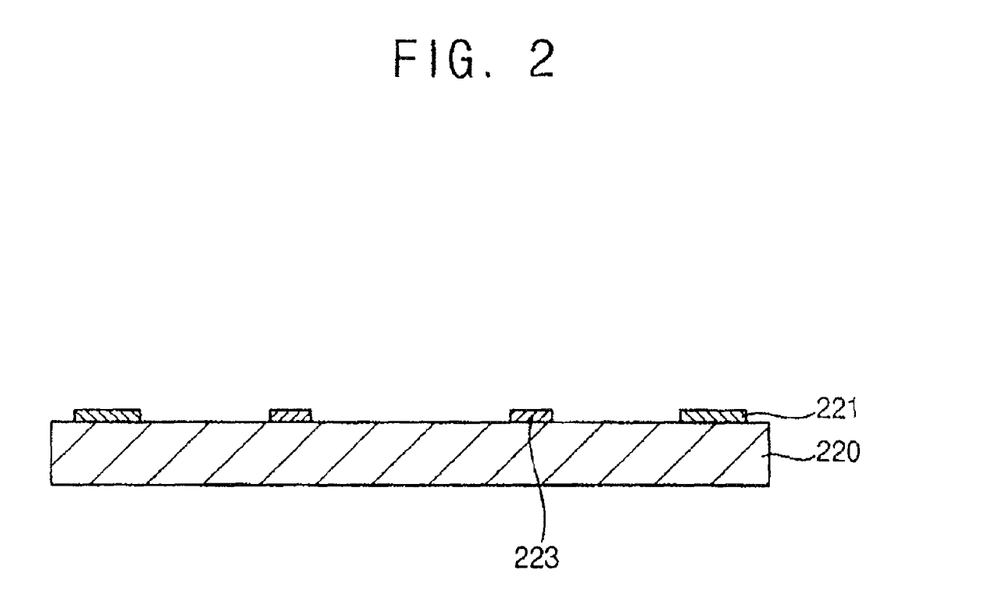
FIGS. 2 to 6 are cross sectional views illustrating an example embodiment of a method of manufacturing a semiconductor device in accordance with aspects of the present invention.

Referring to FIG. 2, a circuit board 220 having integrated circuits is provided. A first land 221 and a second land 223 are then formed on the circuit board 220. The first land 221 is formed on the circuit board 220 corresponding to a position where a lead of the semiconductor package is to be mounted in a subsequent process. The second land 223 is formed on the circuit board 220 corresponding to a position where an interval maintaining member is to be formed in a following process.

The second land 223 is formed at a position to face a lower face of a semiconductor package, which is stacked over the circuit board 220 in a subsequent process. The second land 223 can be formed in a plural number. In some example embodiments, two second lands are formed at positions to face a peripheral portion of the semiconductor package. In other example embodiments, when the semiconductor package has a rectangular plate shape, four second lands are formed at positions to face four corner portions of the semiconductor package.

Particularly, a metal layer (not shown) is formed on the circuit board 200. The metal layer can be formed using a metal such as copper (Cu), aluminum (Al), aluminum alloy, etc. The metal layer can be formed by a plating process, a sputtering process, a chemical vapor deposition (CVD) process, etc. A photoresist pattern (not shown) is formed on the metal layer, and then the metal layer is partially etched using the photoresist pattern as an etch mask to form the first land 221 and the second land 223 on the circuit board 200.

Figure 3:
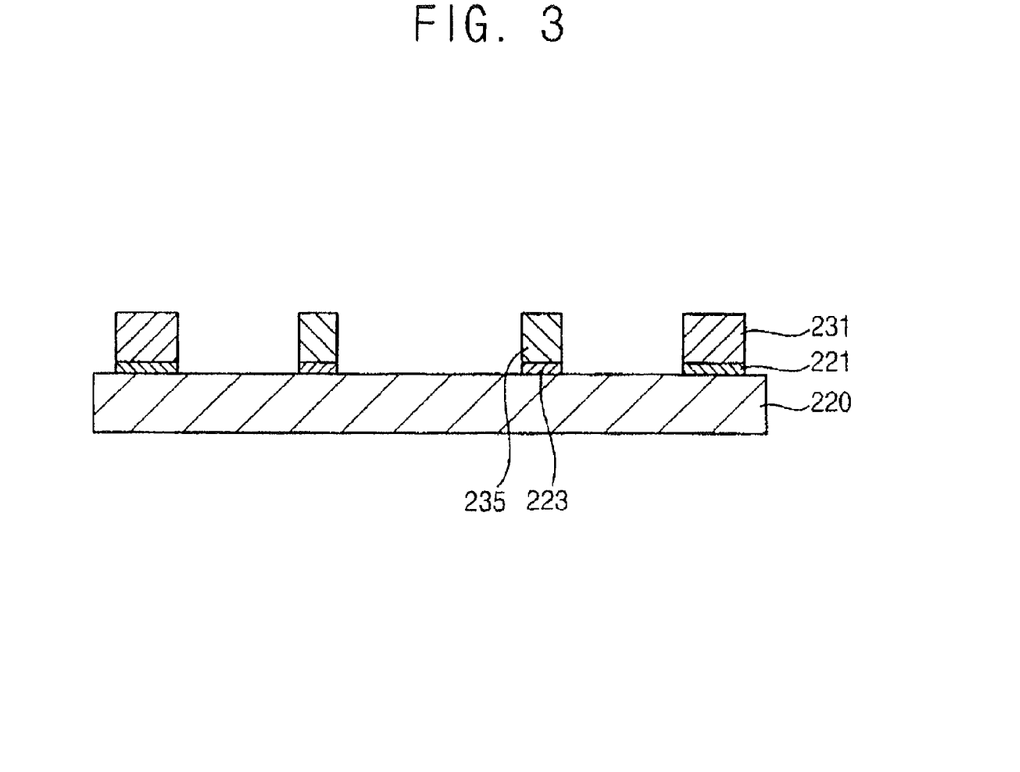

Referring to FIG. 3, a first solder 231 is formed on the first land 221. The first solder 231 can have a spherical shape. The first solder 231 can be formed using a first material having a first melting point. For example, the first solder 231 includes the alloy, which is manufactured by melting a first mixture and a second mixture at a volume ratio of about 9:1. The first mixture can include tin (Sn), silver (Ag) and copper (Cu) at a weight ratio of about 96.5:3.0:0.5, whereas the second mixture can include tin (Sn) and bismuth (Bi) at a weight ratio of about 42.0:58.0. When the first solder 231 includes the alloy that is manufactured by melting the first mixture and the second mixture at the volume ratio of about 9:1, the first solder 231 has a melting point of about 170° C.

In example embodiment of FIG. 3, the first solder 231 can be formed to cover the first land 221. A thickness and an area of the first solder 231 can be adjusted considering an interval between the first land 231 and an end portion of the lead of the semiconductor package.

A second solder 235 is formed on the second land 223. The second solder 235 is formed using a material different from that of the first solder 231. The second solder 235 is formed using a second material having a second melting point substantially higher than the first melting point of the first solder 231. For example, the second solder 235 can be formed using an alloy having tin (Sn), silver (Ag), and copper (Cu). When the second solder 235 can be formed using the alloy having tin (Sn), silver (Ag), and copper (Cu) at a weight ratio of about 96.5:3.0:0.5, the second solder 235 has the second melting point of about 217° C.

The second solder 235 is formed to cover the second land 223. A thickness and an area of the second solder 235 can be adjusted considering the interval between the first land 221 and the end portion of the lead, and the area of the second land 223.

Further, a sequence of forming the first and the second solders 231 and 235 is not restricted. For example, after forming the first solder 231, the second solder 235 can be formed. Alternatively, after forming the second solder 235, the first solder 231 can be formed.

Figure 4:
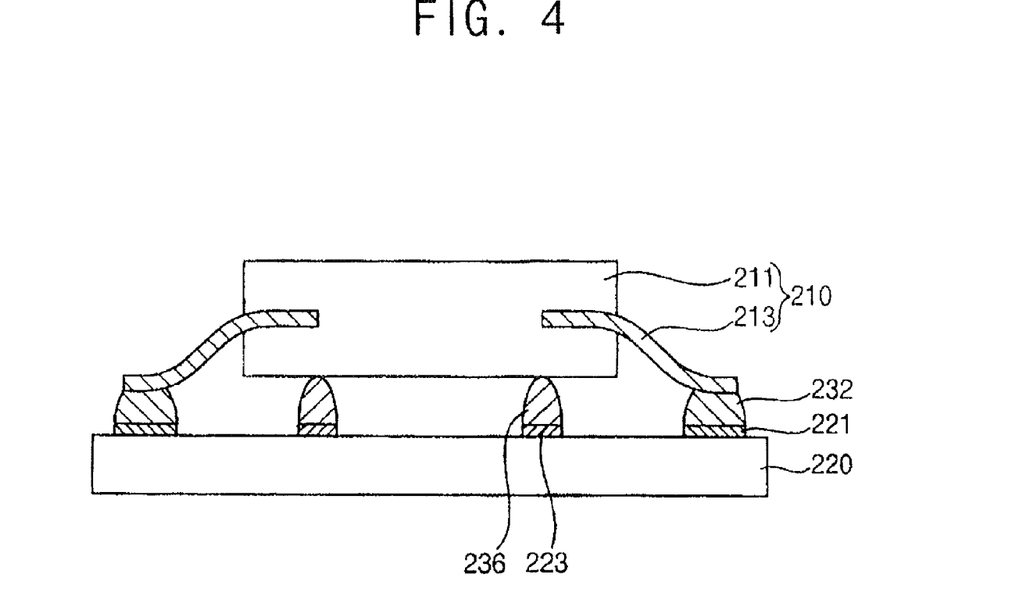

Referring to FIG. 4, an embodiment of the semiconductor package 210 including a body 211 and a lead 213 protruded from the body 211 is provided. The semiconductor package 210 is positioned over the circuit board 200. The end portion of the lead 213 is positioned to face the first solder 232 to interpose the first solder 232 between the end portion of the lead 213 and the first land 221. The body 211 is positioned to face the second solder 236 to interpose the second solder 236 between the body 211 and the second land 223.

The circuit board 220 and the semiconductor package 210 positioned over the circuit board 220 is loaded into a reflow furnace. A temperature of the reflow furnace is maintained over the second melting point. For example, the temperature of the reflow furnace is maintained at a temperature of about 250° C. Thus, the first and the second solders 231 and 235, respectively are melted so that a first melt solder 232 is formed on the first land 221 and a second melt solder 236 is formed on the second land 223.

Figure 5:
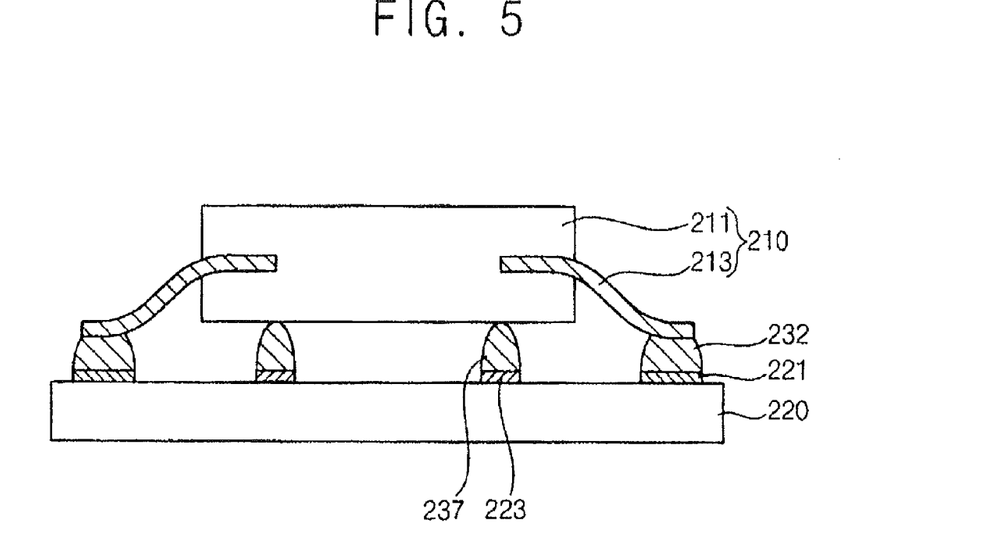

Referring to FIG. 5, the reflow furnace is adjusted for maintaining a temperature between the first melting point and the second melting point to solidify the second melted solder 236. Thus, a second solidified solder 237 is formed from the second melted solder 235 on the second land, whereas the first melted solder 232 is maintained in a liquid state.

The second solidified solder 237 has an area substantially the same as that of the second land 223. The second solidified solder 237 can have a dome shape because of a surface tension of the second solidified solder 237. Further, a height of the second solidified solder 237 can be adjusted for maintaining an interval between the first land 221 and the end portion of the lead 213. For example, the second solidified solder 237 can have a height of about 150 μm to about 250 μm.

The second solidified solder 237 corresponds to an interval maintaining member. Thus, a reference numeral 237 refers to the interval maintaining member as well as the second solidified solder. The interval maintaining member 237 maintains the interval between the first land 221 and a first solidified solder, which is formed by solidifying the first melted solder 232 in a following process.

Figure 6:
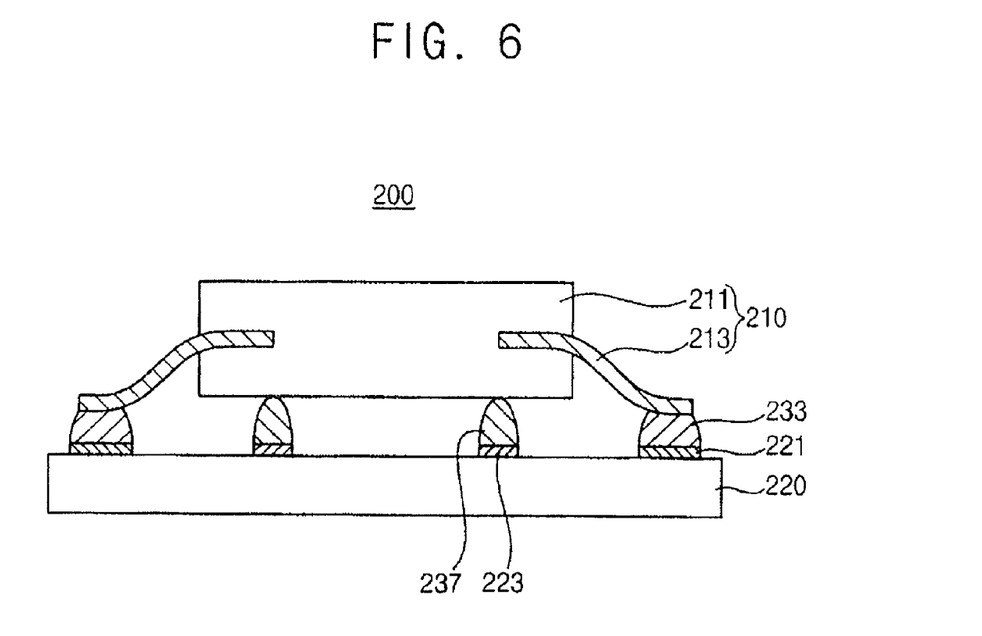

Referring to FIG. 6, when the reflow furnace is maintained at a temperature under the first melting point, the first melted solder 232 is solidified to form the first solidified solder 233 on the first land 221. The first solidified solder 233 corresponds to a conductive member. Thus, a reference numeral 233 refers to the conductive member as well as the first solidified solder 233.

The conductive member 233 mechanically connects the lead 213 to the first land 221, so that the lead 213 electrically connects with the first land 221. When the first melted solder 232 is solidified to be transformed into the first solidified solder 233, the interval maintaining member 237 keeps the interval between the first land 221 and a lower face of the end portion of the lead 213, which is referred as standoff. For example, a standoff measured from an upper face of the circuit board 220 can be in a range of about 30 μm to 120 μm.

As a result, a semiconductor device 200 including the semiconductor package 210, the circuit board 220, the conductive member 233 and the internal maintaining member 237 is manufactured.

Figure 7:
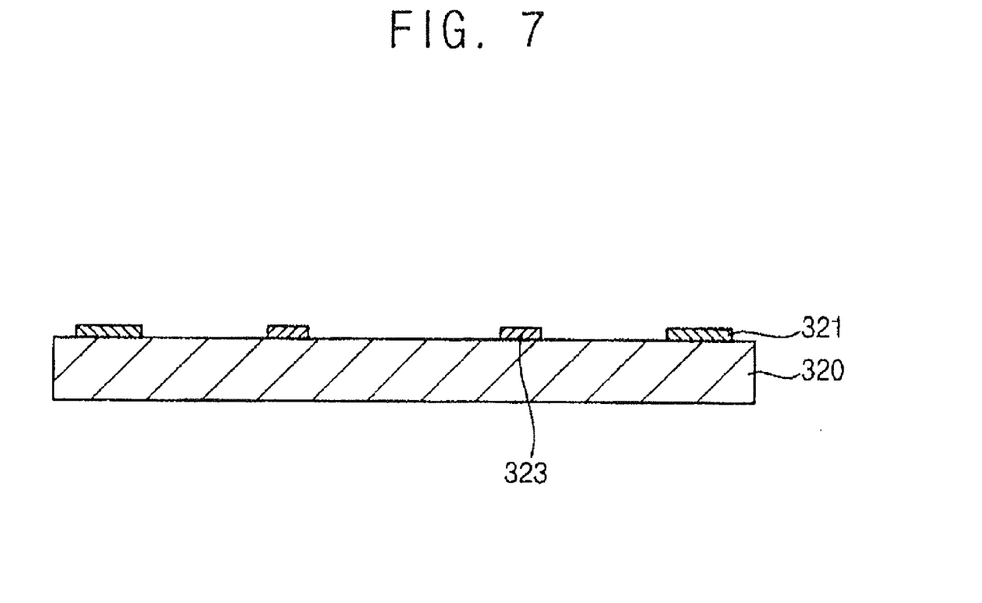
FIGS. 7 to 12 are cross sectional views illustrating example embodiment of a method of manufacturing a semiconductor device in accordance with another aspect of the present invention.
Figure 11:
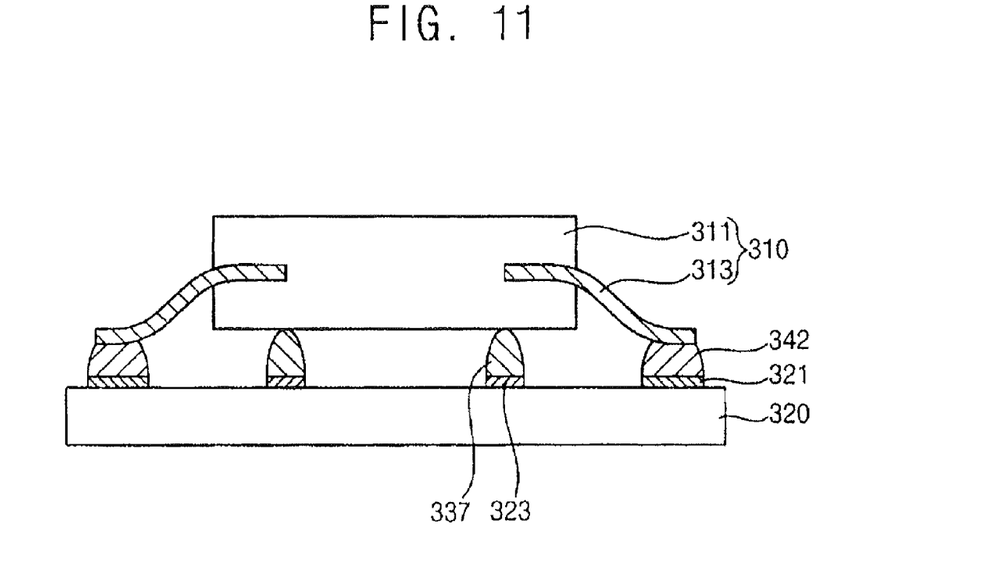
Figure 12:
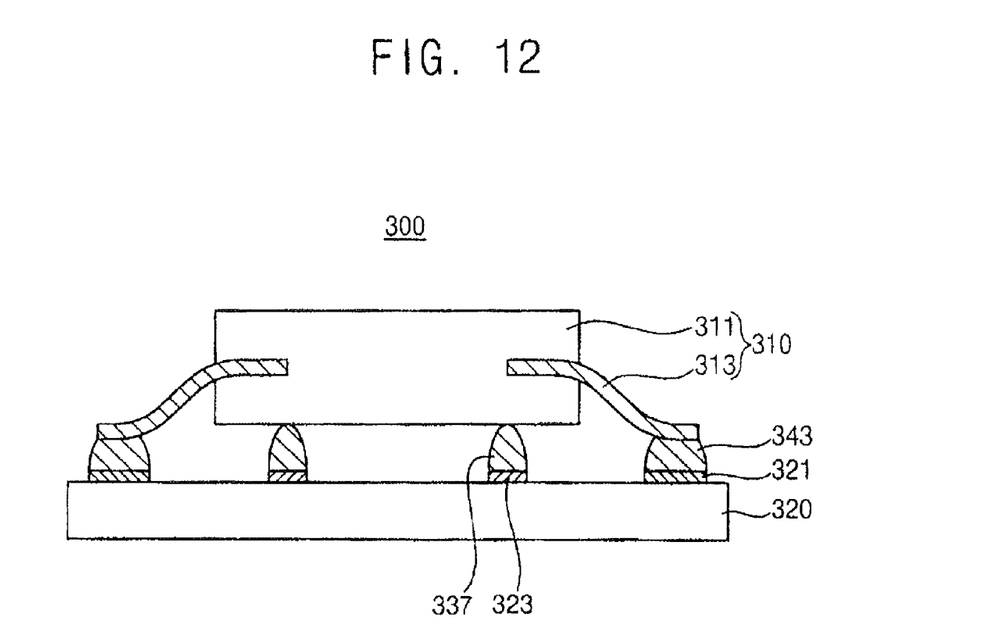

FIGS. 7 and 12 are cross sectional views illustrating an example embodiment of a method of manufacturing a semiconductor device in accordance with another aspect of the present invention.

Referring to FIG. 7, a circuit board 320 having integrated circuits is provided, a first land 321 and a second land 323 are then formed on the circuit board 320. The first land 321 is formed on the circuit board 320 at a position where a lead of the semiconductor package is mounted in a subsequent process. The second land 323 is formed on the circuit board 320 at a position where an interval maintaining member is formed in a subsequent process. The second land 223 is formed at a position to face a lower face of a semiconductor package, which is stacked over the circuit board in a subsequent process. The second land 223 can be formed in a plural number.

Figure 8:
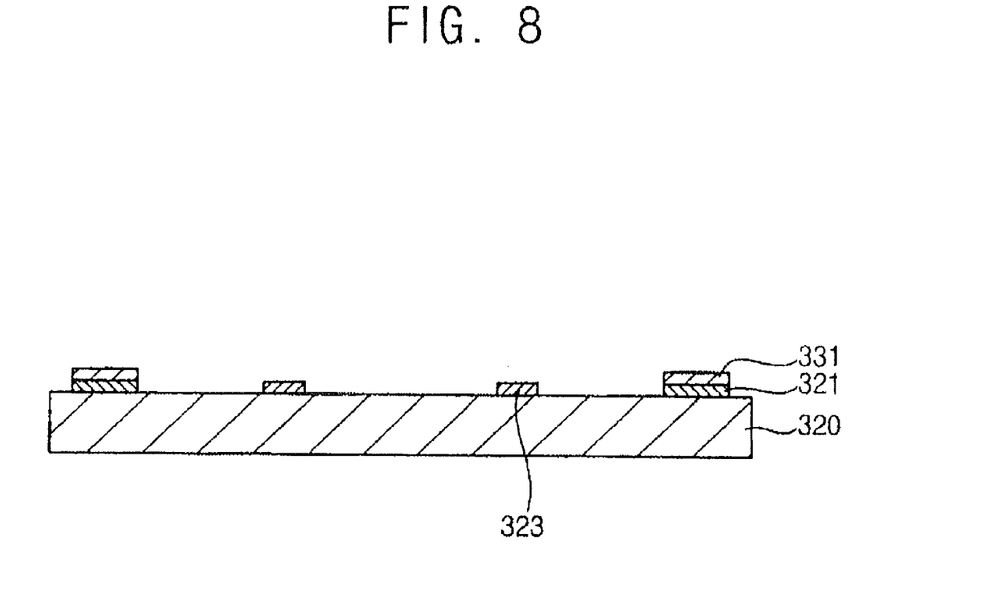

Referring to FIG. 8, a preliminary first solder 331 is formed on the first land 321. The preliminary first solder 331 can have a spherical shape. The preliminary first solder 331 can be formed using a first material having a first melting point. For example, the preliminary first solder 331 can include an alloy, which is manufactured by melting tin (Sn) and bismuth (Bi). When the first preliminary solder 331 is formed using the alloy having tin (Sn) and bismuth (Bi) at a weight ratio of 42.0:58.0, the first solder 331 has a melting point of about 137° C.

Figure 9:
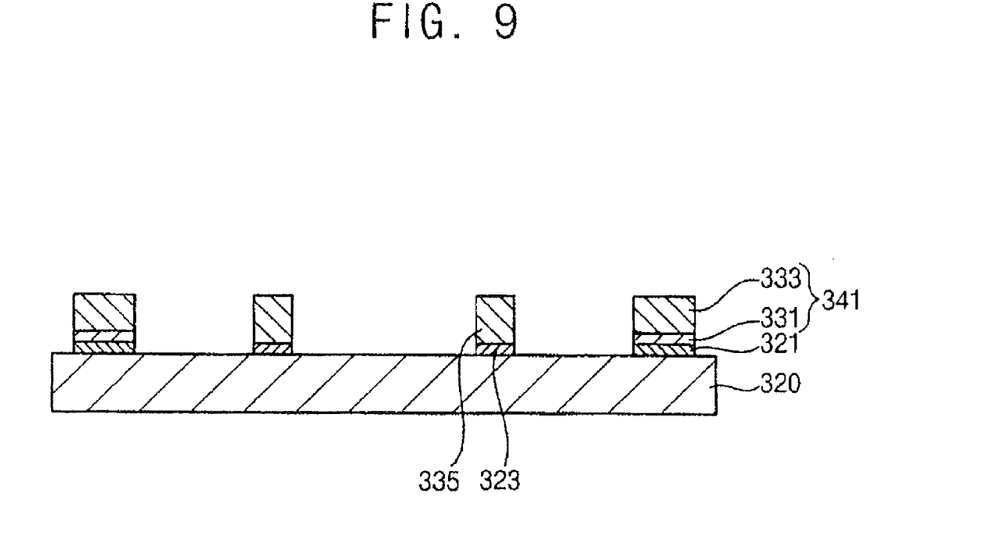

Referring to FIG. 9, a second solder 335 is formed on the second land 323. The second solder 335 can be formed using a material different from that of the first solder 331. Further, the second solder 335 can be formed using a second material having a second melting point higher than that of the first melting point of the first solder 331. For example, the second solder 335 can be formed using an alloy including tin (Sn), silver (Ag) and copper (Cu). When the second solder 335 is formed using the alloy including tin (Sn), silver (Ag) and copper (Cu) at a weight ratio of about 96.5:3.0:0.5, the second solder 335 has a melting point of about 217° C.

A second preliminary solder 333 is further formed on the first preliminary solder 331, which is formed on the first land 321. The second preliminary solder 333 can be substantially the same as the second solder 335. Thus, the first preliminary solder 331 and the second preliminary solder 333 is formed on the first land 321 to form a first solder 341. When the first solder 341 including the first preliminary solder 331 and the second preliminary solder 333 is loaded at a reflow furnace, the first solder 341 is melted at a third melting point between the first and the second melting points. For example, when the first solder 341 corresponds to a mixture of the first and the second preliminary solders 331 and 333 at a volume ratio of about 9:1, the first preliminary solder 331 including tin (Sn) and bismuth (Bi) at a weight ratio of about 42.0:58.0, and the second preliminary solder 333 including tin (Sn), silver (Ag) and copper (Cu) at a weight ratio of about 96.5:3.0:0.5, the first solder 341 has a third melting point of about 170° C.

Figure 10:
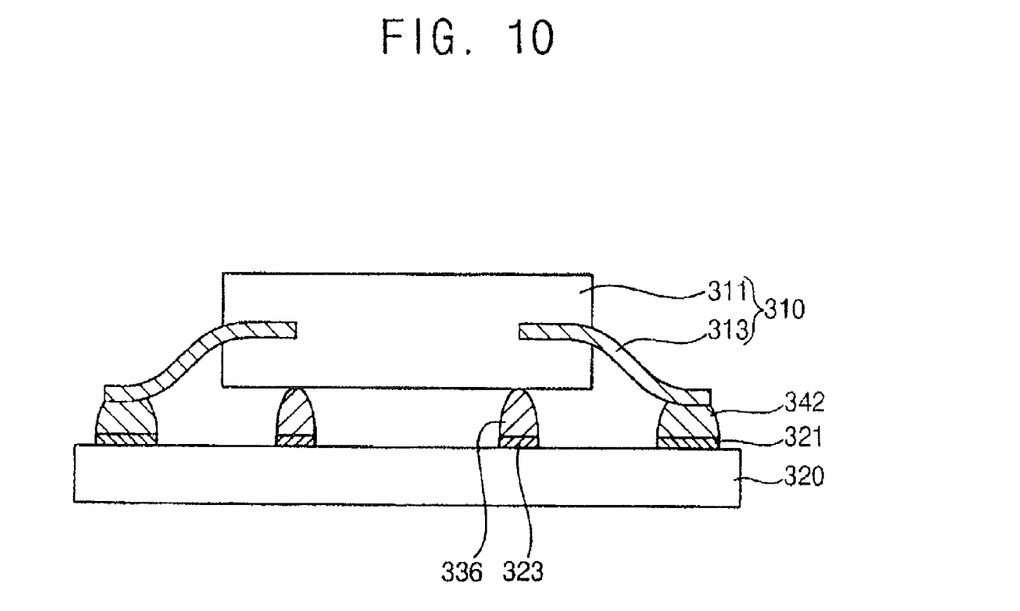

Referring to FIG. 10, the semiconductor package 310 including a body 311 and a lead 313 protruded from the body 311 is provided. The semiconductor package 310 is positioned over the circuit board 320. An end portion of the lead 313 is positioned to face the first solder 341 such that the first solder 341 is interposed between the end portion of the lead 313 and the first land 321. The body 311 is positioned to face the second solder 335 such that the second solder 335 is interposed between the body 311 and the second land 323.

The circuit board 320 and the semiconductor package 310 positioned over the circuit board 320 is loaded into a reflow furnace in which a temperature is maintained over the second melting point. For example, when the reflow furnace is maintained at a temperature of about 250° C., the first and the second solder 341 and 335 are melted to form a first melted solder 342 on the first land 321 and a second melted solder 336 on the second land 323.

Referring to FIG. 11, when the reflow furnace is adjusted for maintaining a temperature between the first melting point and the third melting point, the second melted solder 336 is solidified to form a second solidified solder 337 on the second land 323, whereas the first melted solder 342 maintains in a liquid state. The second solidified solder 337 corresponds to an interval maintaining member. Thus, a reference numeral 337 refers to the interval maintaining member as well as the second solidified solder. The interval maintaining member 337 maintains the interval between the first land 321 and a first solidified solder, while the first melted solder 342 is solidified in a following process.

The second solidified solder 337 has an area substantially identical to that of the second land 323. The second solidified solder 337 can have a dome shape because of a surface tension of the second solidified solder 337. Further, a height of the second solidified solder 337 can be adjusted for maintaining an interval between the first land 321 and the end portion of the lead 313. For example, the second solidified solder 337 has a height of about 150 μm to about 250 μm.

Referring to FIG. 12, when the reflow furnace is maintained at a temperature under the third melting point, the first melted solder 342 is solidified to form the first solidified solder 343 on the first land 321. The first solidified solder 343 corresponds to a conductive member. Thus, a reference numeral 343 refers to the conductive member as well as the first solidified solder.

The conductive member 343 mechanically joins the lead 313 to the first land 321 to electrically connect the lead 313 to the first land 221. When the first melted solder 342 is solidified to be transformed into the first solidified solder 343, the interval maintaining member 337 keeps the interval between the first land 321 and a lower face of the end portion of the lead 313, which is referred as standoff. For example, a standoff measured from an upper face of the circuit board 220 is in a range of about 30 μm to 120 μm.

Accordingly, a semiconductor device 300 including the semiconductor package 310, the circuit board 320, the conductive member 343 and the internal maintaining member 337 is manufactured.

According to the present invention, a semiconductor device includes an interval maintaining member. The interval maintaining member is formed between a body of a semiconductor package and a circuit board to uniformly maintain an interval between a lead and a land. Thus, when a thermal-mechanical shock is applied to a solder interposed between the lead and the land, a shear strain, which can be applied to the solder having a predetermined height, can decrease. As a result, a thermal-mechanical reliability between the lead and the land can be improved.

In addition, the interval maintaining member interposed between the body of the semiconductor package and the circuit board can absorb an external mechanical shock to improve the reliability of the semiconductor device.

The foregoing is illustrative of the present invention and is not to be construed as limiting thereof. Although a few example embodiments in accordance with the present invention have been described, those skilled in the art will readily appreciate that many modifications are possible in the example embodiments without materially departing from the novel teachings and advantages of this invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device, comprising:
    providing a semiconductor package including a body and a lead protruded from the body;
    providing a circuit board including a first land electrically connected to the lead and a second land being partially overlapped with a lower face of the body;
    forming an interval maintaining member on the second land, the interval maintaining member maintaining an interval between the lead and the first land; and
    soldering the lead to the first land using a first solder,
    wherein the interval maintaining member has a melting point that is higher than a melting point of the first solder.

2. The method of claim 1, wherein forming the interval maintaining member comprises forming a second solder on the second land, the second solder including a material different from the first solder.

3. A method of manufacturing a semiconductor device, comprising:
    providing a semiconductor package including a body and a lead protruded from the body;
    providing a circuit board including a first land electrically connected to the lead and a second land being partially overlapped with a lower face of the body;
    forming an interval maintaining member on the second land, the interval maintaining member maintaining an interval between the lead and the first land, soldering the lead to the first land using a first solder, wherein forming the interval maintaining member comprises forming a second solder on the second land, the second solder including a material different from the first solder
    soldering the lead to the first land using a first solder,
    wherein the first solder is formed using a first material having a first melting point and the second solder is formed using a second material having a second melting point higher than the first melting point.

4. The method of claim 3, wherein the first solder is formed from an alloy comprising tin (Sn) and bismuth (Bi), and the second solder is formed from an alloy comprising tin (Sn), silver (Ag) and copper (Cu).

5. The method of claim 3, wherein forming the interval maintaining member comprises:
    forming the second solder on the second land;
    melting the first and the second solders at a temperature higher than the second melting point; and
    solidifying the second solder at a temperature between the first and the second melting points.

6. The method of claim 5, wherein soldering the lead comprises solidifying the first solder at a temperature below the first melting point.

7. The method of claim 1, wherein a plurality of the interval maintaining members are formed on a plurality of the second lands, and the interval maintaining members make contact with a lower face of a peripheral portion of the semiconductor package, adjacent to the first land.

* * * * *